(12) United States Patent
Parkinson

(10) Patent No.: US 8,018,786 B2
(45) Date of Patent: *Sep. 13, 2011

(54) METHOD FOR READING SEMICONDUCTOR MEMORIES AND SEMICONDUCTOR MEMORY

(75) Inventor: Ward Parkinson, Boise, ID (US)

(73) Assignee: STMicroelectroncis S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 12/717,059

(22) Filed: Mar. 3, 2010

(65) Prior Publication Data

US 2010/0157666 A1 Jun. 24, 2010

Related U.S. Application Data

(63) Continuation of application No. 11/848,997, filed on Aug. 31, 2007, now Pat. No. 7,692,958.

(30) Foreign Application Priority Data

Sep. 1, 2006 (EP) ..................................... 06425610

(51) Int. Cl.
*G11C 7/00* (2006.01)

(52) U.S. Cl. ......... 365/189.14; 365/189.15; 365/189.07; 365/189.09

(58) Field of Classification Search ............. 365/189.14, 365/189.15, 189.07, 189.09
See application file for complete search history.

(56) References Cited

U.S. PATENT DOCUMENTS

| 6,707,712 B2 * | 3/2004 | Lowery .......................... 365/175 |
| 6,831,856 B2 | 12/2004 | Pashmakov | |
| 6,967,865 B2 | 11/2005 | Lee | |
| 7,050,328 B2 * | 5/2006 | Khouri et al. ................. 365/163 |
| 2006/0181922 A1 | 8/2006 | Dodge et al. | |

FOREIGN PATENT DOCUMENTS

EP 1 306 852 A2 5/2003

* cited by examiner

*Primary Examiner* — Son T Dinh
(74) *Attorney, Agent, or Firm* — Lisa K. Jorgenson; Robert Iannucci; Seed IP Law Group PLLC

(57) ABSTRACT

A phase change memory cells including a memory element or a threshold device is read using a read current which does not threshold either the memory element or the threshold device in the case of both a set and a reset memory element. As a result, higher currents may be avoided, increasing read endurance. A sensing circuit includes a charging rate detector coupled to a selected address line and sensing a rate of change of a voltage on the selected address line.

32 Claims, 5 Drawing Sheets

METHOD FOR READING SEMICONDUCTOR MEMORIES AND SEMICONDUCTOR MEMORY

BACKGROUND

1. Technical Field

This invention relates generally to semiconductor memories.

2. Description of the Related Art

Phase change memory devices use phase change materials, i.e., materials that may be electrically switched between a generally amorphous and a generally crystalline state, as an electronic memory. One type of memory element utilizes a phase change material that may be electrically switched between generally amorphous and generally crystalline local orders or between different detectable states of local order across the entire spectrum between completely amorphous and completely crystalline states.

Typical materials suitable for such an application include various chalcogenide elements. The state of the phase change materials is also non-volatile, absent application of excess temperatures, such as those in excess of 150° C. for extended times. When the memory is set in either a crystalline, semi-crystalline, amorphous, or semi-amorphous state representing a resistance value, that value is retained until reprogrammed, even if power is removed. This is because the programmed value represents a phase or physical state of the material (e.g., crystalline or amorphous).

The memory cells can be selected for a reading operation, for example, by applying suitable voltages to the respective word lines and suitable current pulses to the respective bit lines. A voltage reached at the bit line depends on the resistance of the storage element, i.e., the logic value stored in the selected memory cell.

The logic value stored in the memory cell is evaluated by using sense amplifiers to detect a difference in voltage and/or current reflecting the state of the memory. Typically, a sense amplifier includes a comparator receiving the bit line voltage, or a related voltage, and a suitable reference voltage for comparison to the level from the memory, after a period. For example, where the bit line voltage is higher than the reference voltage after a period of time, the memory state stored is described as a reset or logic value "0", whereas in the case in which the bit line voltage is lower than the reference voltage, the stored logic value is described as set or a "1".

The access element can consist of a threshold switch made of a phase-change material, similar to the storage element serially connected thereto. This element switches (potentially without changing its phase) from a high-resistance condition to a low-resistance condition when a voltage applied thereacross exceeds a threshold value and may revert to the high-resistance condition when a current flowing therethrough falls below a minimum holding value. While in the reset state, a transition from the high resistance to low resistance may entail a negative resistance range where, if the capacitance and transient current are low or of short duration, the phase state may be retained for some number of cycles without refreshing or rewriting the reset state. A voltage across the access element in the low-resistance condition has a substantially constant value (holding voltage) because the dynamic resistance dV/dI is relatively low so most of the voltage drop is a holding voltage, Vh, because the voltage is Vh+current×dV/dI. In this case, the matrix of memory cells can be advantageously provided without any transistor, and then using a single technological process.

During a reading operation, the read current pulse causes the charging of stray capacitance intrinsically associated with the bit line, and, accordingly, causes a corresponding transient of the bit line voltage on a selected bit line. If charged positively, the respective bit line voltage raises towards a corresponding steady value, depending on the logic value stored in the selected memory cell.

Generally, the write endurance or the number of write cycles that a phase change memory may withstand is lower for writing than reading. However, triggering a threshold device on during reading forces significant read and capacitive current through the threshold device and the memory element which may adversely affect lifetime and/or endurance.

BRIEF SUMMARY

One embodiment of the invention is a method of reading which overcomes the drawbacks of the prior art.

On embodiment is a phase-change memory device, that includes:

an array of phase change memory cells, each memory cell including a memory element and a threshold device, series connected to each other;

an address line coupled to the memory cells, a current source structured to drive the address line at a current that forces a current through the memory cell that is less than a threshold current of the memory element and of the threshold device; and a sensing circuit structured to sense the address line while the memory element and the threshold device are still unthresholded.

One embodiment is a method, comprising:

reading a phase change memory device comprising a memory cell including a phase change memory element coupled in series to a threshold device, the reading including:

selecting an address line connected to said memory cell;

applying a reading current to the memory cell;

reading the memory cell when the memory element and the threshold device are unthresholded; and interrupting the reading current.

BRIEF DESCRIPTION OF THE SEVERAL VIEWS OF THE DRAWINGS

For the understanding of the present invention, preferred embodiments are now described, purely as a non-limitative example, with reference to the enclosed drawings, wherein.

DETAILED DESCRIPTION

Figure 1:
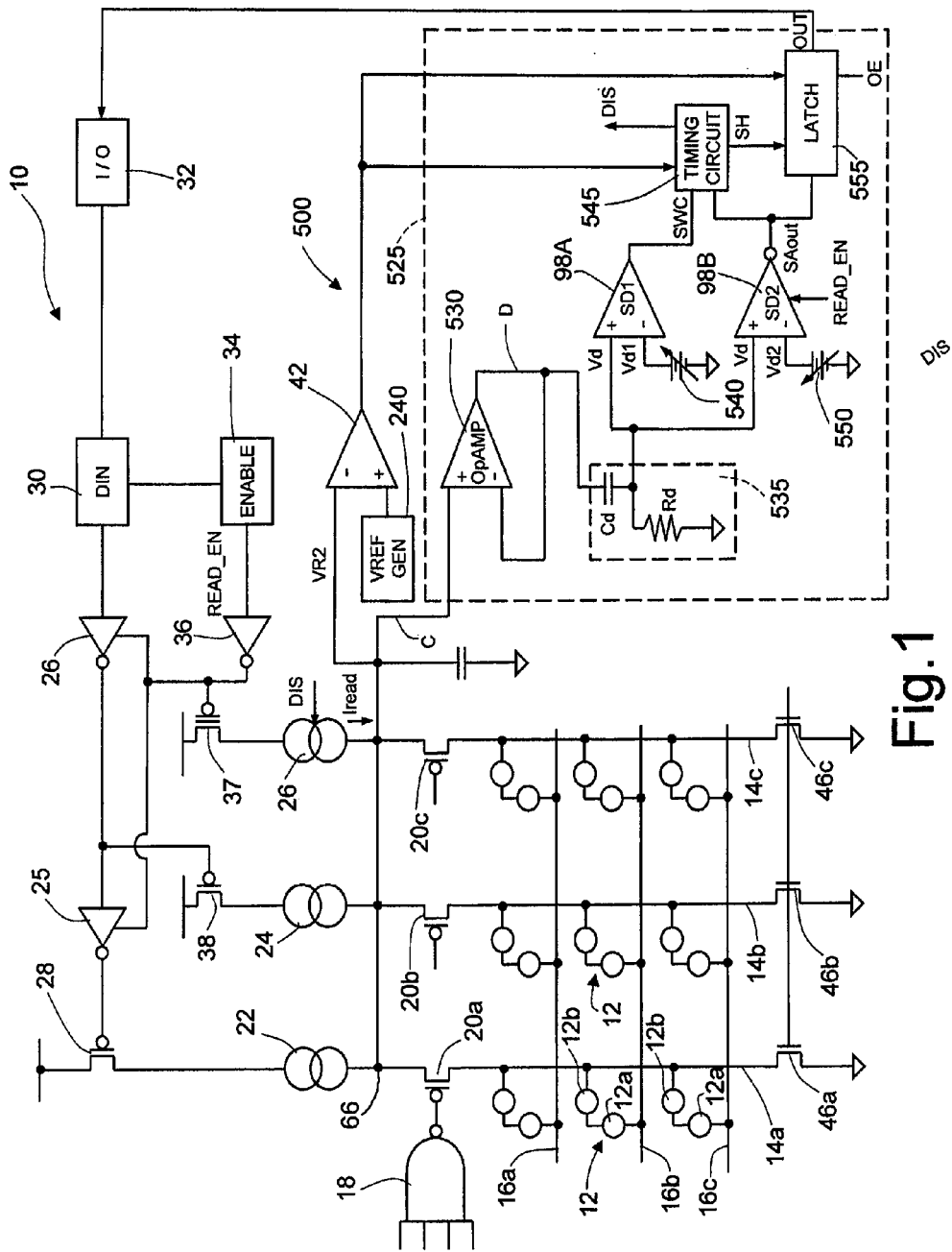
FIG. 1 is a circuit diagram for an embodiment of the present invention.

In FIG. 1, timing to stop the read cycle is generated by sensing a change in slope for charging the column line.

Thereby, thresholding or triggering of both the memory element and the threshold device is prevented, thereby increasing the read endurance. This may be done while maintaining adequate margin. Furthermore, the rate of charging may be used to determine the cell state for improved margin.

The circuit of FIG. 1 may be used to reduce sensitivity to the triggering voltage of the threshold device and improve timing accuracy and read speed (compared to a fixed timeout), thus improving read delay and voltage margin during read.

Referring to FIG. 1, a memory 10 includes an array of memory cells 12 arranged in rows ("wordlines") 16 and columns ("bitlines") 14. While a relatively small array is illustrated, the present invention is in no way limited to or requires any particular size of an array. While the terms "rows" and "columns" are used herein, they are merely meant to be illustrative and are not limiting with respect to the type and style of the sensed array.

The memory 10 also includes a number of auxiliary lines, useful for the operation thereof. In particular, the memory 10 is provided with a supply voltage line distributing a supply voltage through a chip including the memory, that, depending on the specific memory device, may be, typically, in the range from 1 to 3 V, for example 1.8 V. A further supply voltage line (such as a ground voltage line GND) distributes the ground voltage, or a negative voltage may replace ground or be provided in addition to ground. An additional high voltage supply line may assist operation such as writing by providing a relatively higher voltage than the power supply, generated by devices (e.g., charge-pump voltage boosters not shown) integrated on the same chip, or externally supplied to the memory; for example 4.5-5 V that may, for example, be helpful during write.

The memory cell 12 is a phase change memory cell including a memory element 12b which stores a bit of data and an access, select, or threshold device 12a. In one embodiment, the threshold device 12a is an ovonic threshold switch (OTS) that is made of an alloy of chalcogenide that does not switch from an amorphous to a crystalline phase and which undergoes a rapid, electric field initiated change in conductivity, a change in conductivity that persists only so long as a holding current through the device is present. Alternatively, the threshold device 12a can be a transistor, such as a bipolar or a MOS transistor.

Figure 7:
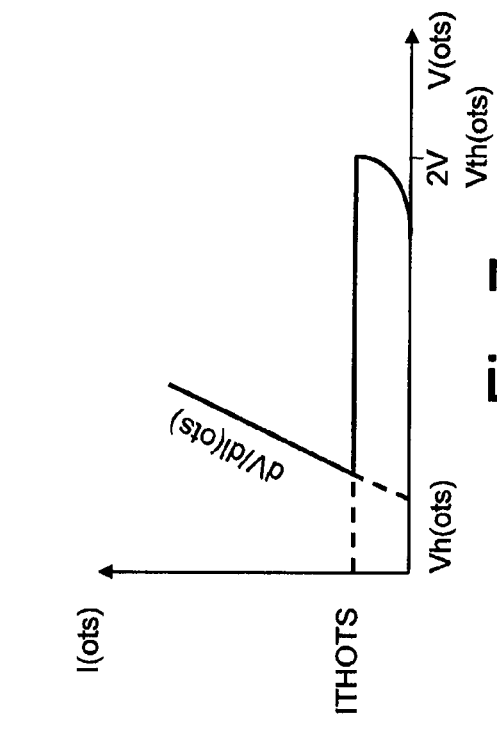
FIG. 7 is a depiction of current versus voltage for a threshold device.

The threshold device 12a has preferably a reduced snapback voltage, such as 0.6V, as the difference between the threshold voltage Vth(ots) and holding voltage Vh(ots) of the threshold device (see FIG. 7). Upon thresholding, the voltage across threshold device 12a snaps back from threshold voltage Vth(ots) to holding voltage Vh(ots).

The memory material used in the memory element 12b is a phase change material suitable for non-volatile memory data storage.

In a reset state (logic "1"), the memory material is in an amorphous or semi-amorphous state and in a set state (logic "0"), the memory material is in a crystalline or semi-crystalline state. The resistance of the memory material in the amorphous or semi-amorphous state is greater than the resistance of the material in the crystalline or semi-crystalline state. The association of reset and set with amorphous and crystalline states, respectively, is a convention. Other conventions may be adopted, such as referring to a reset bit as a logic "0" and a set bit as a logic "1".

Here, the information stored in memory material is read by measuring the resistance of the memory material. In particular, the read current is provided to the memory material using opposed lines 14, 16 and the resulting read voltage across the memory material is compared against a reference voltage. The read voltage is proportional to the resistance exhibited by the selected memory element 12b.

In a low voltage or low field regime, the threshold device 12a is off and exhibits very high resistance. The off resistance can, for example, range from 50 kΩ to greater than 10 gigaΩ at a bias of half the threshold voltage. The threshold device 12a remains in its off state until the voltage across the device exceeds a threshold voltage or until a current greater than threshold current switches the threshold device 12a, thus shifting threshold device operation from a high resistance off-regime through a lower or negative resistance regime to a highly conductive, low resistance on-regime. The voltage across the threshold device 12a after switching drops to a slightly lower value (depending on series resistance or current compliance limit of the voltage source). This voltage is called the holding voltage Vh(ots) and may remain very close to this holding voltage almost regardless of current flowing, since the dynamic resistance is low, frequently less than 1 kΩ (now in series with its holding voltage). Voltage across the threshold device 12a in this regime is:

$$Vh(ots)+\text{current flowing in the device} \times dV/DI.$$

Figure 6:
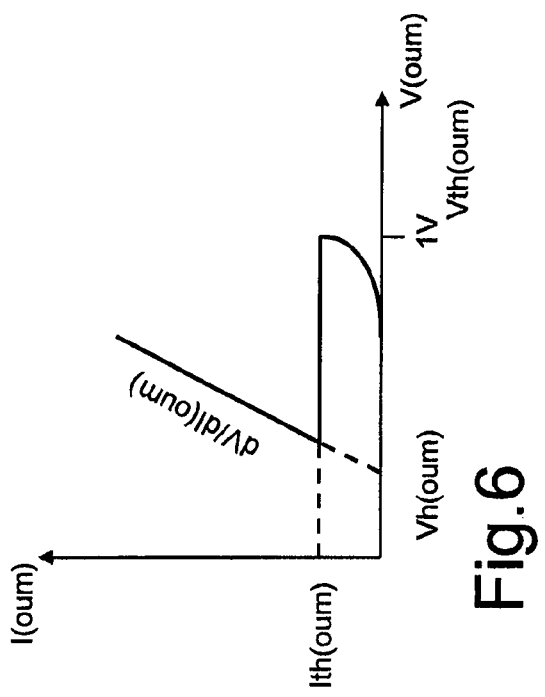
FIG. 6 is a graph of current versus voltage for a phase change memory element.

For example, the threshold voltage of the threshold device 12a may be on the order of 3 V and the holding voltage may be on the order of 2.5 V, where the difference may be less than the threshold voltage of the memory element, Vth(oum), see FIG. 6.

After passing through the snapback region, in the on state, the voltage drop of the threshold device 12a remains close to the holding voltage as the current passing through the device is increased, even if up to a relatively high, current level. Above that current level, the device remains on but displays a finite differential resistance with the voltage drop increasing with increasing current. The threshold device 12a may remain on until the current therethrough is reduced below a characteristic holding current value that is dependent on the area of the material and the holding voltage is affected by the choice of top and bottom electrodes utilized to form the threshold device 12a (see FIG. 7).

According to one embodiment, the threshold device 12a does not change phase. It remains permanently amorphous and its current-voltage characteristics may remain about the same throughout its operating life.

As an example, for a threshold device 12a having a 0.5 μm diameter formed of TeAsGeSSe having respective atomic percents of 16/13/15/1/55, the holding current may be on the order of 0.1 to 1 μA. Below this holding current, the threshold device 12a turns off and returns to the high resistance regime at low voltage, low field applied. The threshold current for the threshold device 12a may generally be of the same order as the holding current. The holding current may be altered by changing process variables, such as the top and bottom electrode material and the chalcogenide material, and/or the contact area between the electrodes and chalcogenide. The threshold device 12a may provide high "on current" for a given area compared to conventional access devices such as metal oxide semiconductor field effect transistors or bipolar junction transistors or semiconductor diodes. However, such devices may also be used, as shall be apparent to one skilled in the art, as an adaptation of the embodiments and descriptions herein.

Turning again to FIG. 1, a decoder 18 receives address signals to select the desired column using select transistors 20a-c uniquely associated with each column for cell selection. A reset write current source 22 is parallel connected to a set write current source 24 and a read current source 26; current sources 22, 24 and 26 are coupled to a node 66 which is coupled to first terminals of selection transistors 20a-c. The read current operation is conducted so that the current through a memory cell 12 does not exceed the threshold current of the memory element 12b or threshold device 12a, and is set to generate a rise time on the selected column (14a or 14b or 14c, with column selection determined by "on" select transistors 20a or 20b or 20c).

The current sources 22, 24 and 26 are coupled to the selected column or columns 14a, 14b, 14c as needed in response to addressing commands from an external memory user such as a processor. Furthermore, read current source 26 may be switched off by a disabling signal DIS generated by a sensing and timing circuit 525, as will be explained later on.

A set of transistors 46a or 46b or 46c are located on the bottom of the columns 14 in order to enable write quenching and to deselect the respective columns 14 so as to assure a fast write current pulse trailing edge on columns 14, when needed. Fast quench is also assisted by simultaneous switching the selected rows 12 from selection to deselection voltage. Alternately instead of a read current source 26, a voltage may be forced which is about equal to a reference level Vref and the compliance limited to the read current (here for example, 5 µA with a threshold current of the memory element 12b of about 10 µA and a threshold current of the threshold device 12a of about 10 µA). Then, if the current driven by the voltage source (not shown) through the memory and select devices 12b, 12a after the transient dies out is greater than the compliance limit current, Iread, the bit is set. Otherwise, the bit is reset. By such techniques, the current forced can also be less than Ith(oum) of memory element 12b, and the devices are not thresholded, that is are not brought to their threshold values.

Transistors 28, 38, and 37 are on/off switches that select the desired current, generated by current source 22, 24 or 26, to the selected column 14 depending on whether the desired function is to write a bit to its reset state, or to write a bit to the set state, or read a selected bit, respectively. A gate 36 either disables reading and enables writing by turning off read current source 26 and enabling write gates 25 and 26, or turns on transistor 37 to enable the read current source 26 and disable write gates 25 and 26. Unless enabled, gates 25 and 26 turn off the write current sources, 22 and 24. The gate 36 is controlled by enable circuit 34. An input/output (I/O) control 32 is coupled to the data-in (Din) circuit 30, which is coupled to select either write "0" or write "1" through selection of either current source 22 or 24, one having less write current to write a "1" (and crystallize) than the other that resets the selected bit to a "0" (amorphous), or in the alternative the write amplitude to the set is the same as reset but the trailing edge is slower or stair stepped down over a period greater than, e.g., 100 nsec. The data-in circuit 30 is write enabled by enable circuit 34.

Reading of the state of the memory elements 12b is carried out by the sensing and timing circuit 525 including operational amplifier 530, differentiating circuit 535, first and second comparators SD1 and SD2, timing circuit 545 and latch 555.

Operational amplifier 530 provides an output voltage D based on a voltage C from a selected column line, e.g., column line 14c. The output voltage D of the operational amplifier 530 is fed back to its input so that the output voltage D tracks its input. Thus, operational amplifier 530 buffers the selected read column voltage C so that output voltage D can drive inputs to comparators SD1 and SD2 through the differentiating circuit 535. Differentiating circuit 535 includes a capacitor Cd and a resistor Rd and produces a differentiated voltage Vd. Thus, the differentiated voltage Vd is essentially a rate of change derivative of the selected read column voltage C from the selected column line 14.

First comparator SD1 has a terminal that receives the differentiated voltage Vd. The first comparator SD1 also receives a first adjustable voltage Vd1 from a first voltage source 540. An output terminal of the comparator SD1 provides an output SWC resulting from comparing the first adjustable voltage Vd1 and the differentiated voltage Vd. Output SWC of first comparator SD1 is provided to timing circuit 545.

Differentiated voltage Vd is also input to second comparator SD2. Second comparator SD2 is coupled to a second voltage source 550 which provides a second adjustable voltage Vd2. The second comparator SD2 provides an output SAout indicative of a comparison between the differentiated voltage Vd and second adjustable voltage Vd2 and represents a cell reading output. Sources 540 and 550 may be on-chip and generated using band-gap techniques to compensate appropriately for temperature and power supply variation using techniques familiar to those skilled in the art.

The first adjustable voltage Vd1 may be selected to be lower than a maximum value reached by the differentiated voltage Vd. The second adjustable voltage Vd2 may be selected to be suitably lower than the voltage of the first voltage source 540, and may be near zero Volts.

The output SAout of the second comparator SD2 is coupled to latch 555 that stores an output signal when enabled by a strobe signal SH from the timing circuit 545. The timing circuit 545 provides the strobe signal SH to the latch 555 according to the outputs from the comparators SD1, SD2, and 42. In particular, a "0" is latched (and read current (read stopped) if either: the selected read column voltage C exceeds Vref, or the output of first comparator SD1 switches because the rate of change causes differentiated voltage Vd to exceed first adjustable voltage Vd1 and then fall below it, but differentiated voltage Vd does not fall below second adjustable voltage Vd2 after a brief timeout, such as about 10-20 nsec (so the bit is latched as a reset bit).

Figure 2:
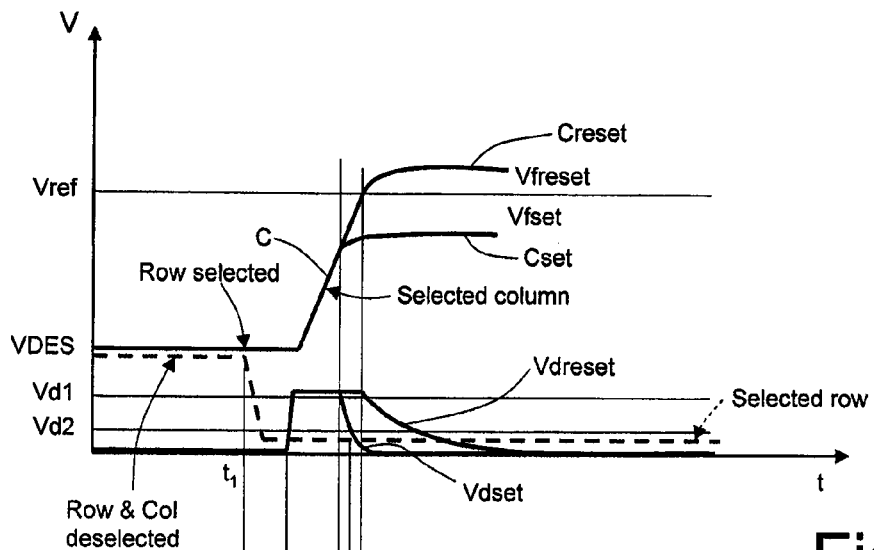
FIG. 2 is a theoretical depiction of voltage versus time for a selected column in accordance with another embodiment of the present invention.

Referring to FIG. 2, the voltages C and Vd over time are shown for a selected column and row in accordance with one hypothetical embodiment.

In standby or when deselected, the column voltage C is equal to VDES which is approximately equal to Vt/2, where Vt is related to the threshold voltages of devices 12a and 12b. VDES may be adjusted die to die by trimming using techniques familiar to those skilled in the art. For example, Vt may be about 2V if the threshold voltage of memory element 12b is typically 1 V with a holding voltage Vh of 0.25V, and the threshold voltage of threshold device 12a is typically 2V with a holding voltage of 0.2V (see FIGS. 6 and 7). While deselected, row 16 has an initially higher voltage such as Vt/2. Other biasing schemes with better voltage margin but increased standby leakage may be used, such as deselecting the columns to 1/3*Vt and the rows to 2/3*Vt when a block is active (and otherwise putting both to zero volts).

During selection of a memory cell 12 for read, first row 14 is selected, time t1; thus, voltage on row 16 falls rapidly, to a steady low select voltage which may be near zero depending on row driver sizing and the amount of column current.

Then, time t2, the selected column current Iread steps up for reading, thus forcing the selected column voltage C to rise, time t3, since the initial column charging is at a peak rate with no current diverted to the memory elements. This initial rate is established and relatively constant over a period, and then starts reducing as current diverts into the memory cell with increasing voltage across the devices 12a and 12b. In practice, selected column voltage C raises from the de-selection voltage VDES towards a steady state Vfset and Vfreset, depending on the logic value stored in the selected memory element 12b.

The differentiated voltage Vd corresponds to the gradient of the selected column voltage C. Accordingly, at the time t3, the differentiated voltage Vd rapidly rises to a value higher than Vd1 and stays relatively constant over a period (the plateau in FIG. 2).

In the meantime, the threshold device 12a does not threshold (trigger) for either memory bit states since the read current Iread is less than the threshold current of whichever is lower, the memory element or threshold device forced to remain below that level by stopping the column charging before the threshold current is exceeded, as discussed below.

If a set bit is stored in the memory element 12b, the selected column voltage C starts decreasing earlier and towards a lower steady state voltage Vfset. In the case where a reset bit is stored, the selected column voltage C, depending on the resistance of the bit, reaches the lower rate portion towards a steady state value well above the value of the set bit. Therefore, according to an embodiment, the rise of the voltage C on the selected column voltage is stopped, by interrupting the reading current Iread, when it exceeds Vref or after a timeout initiated by the switching of the first comparator SD1 (either when the selected column voltage C exceeds Vd1 or falls below Vd1).

Vref is a voltage set low enough to avoid applying more than a threshold voltage across the memory element 12b; thus, the read current is stopped when the selected column voltage C crosses Vref. Stopping the selected column voltage C at or below Vref prevents a reset memory element 12b from thresholding and entering the dV/dI region, which could necessitate refreshing the bit periodically. Such refreshing involves rewriting the bit after reading it, to maintain its higher resistance state. Such refreshing adds to the read cycle time and reduces endurance.

Figure 3:
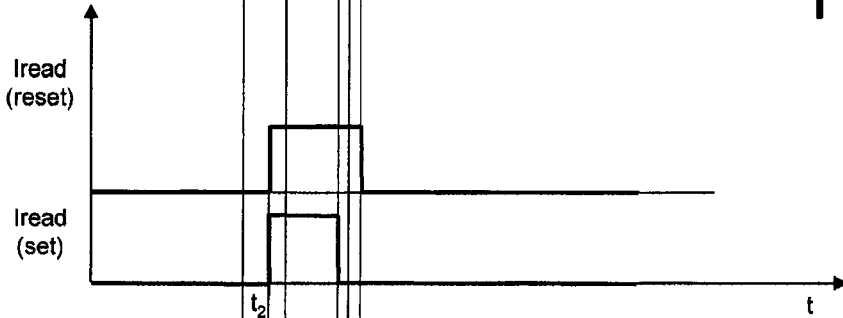
FIG. 3 is a theoretical depiction of the read current timing for the embodiment of FIG. 2.
Figure 4:
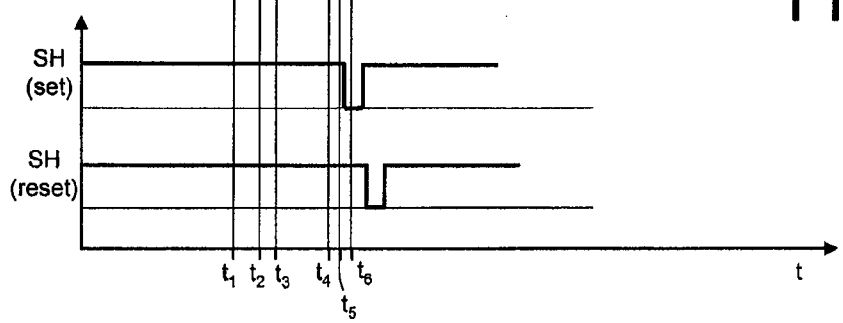
FIG. 4 is a theoretical depiction of the SH latch data signal versus time.

According to FIGS. 2 and 3, when the memory element 12b stores a set bit (low resistance), at time t4 the increase of selected column voltage (indicated by Cset) rapidly reduces and approaches a steady state value since the RC is much lower; thus the differentiated voltage Vdset decreases rapidly, and may even become negative depending on RC sensing rate. At steady state, the differentiated voltage Vdset goes to zero volts. Thus, Vdset for a set bit first falls below Vd1 (time t4) and then below Vd2 (at time t5) before stabilizing at 0 volts. When the differentiated voltage Vdset falls below Vd1 (time t4) or, in the alternative, when it falls below Vd2 (not shown), the read current Iread may be turned off (FIG. 3) since the bit is then determined to be set.

When the memory element 12b stores a reset bit, the selected column voltage has generally the plot indicated by Creset, that is it increases beyond the bending point of Cset. At time t6, the selected column voltage Creset exceeds Vref; thus, the read current Iread is stopped. The selected column voltage Creset may still increase toward Vfreset, but with a lower gradient. Thus, because of the higher resistance of the reset bit (RC much greater), Vd2 is approached more slowly than by the set steady state differentiated voltage Vdset before stabilizing at 0 volts, as the column charging decreases slowly towards zero.

Turning back to FIG. 1, the output SWC from the first comparator SD1 is initially at a low value, and switches to a high logic value after the differentiated voltage Vd exceeds Vd1 (time t3 in FIG. 2). Then, when the column charging rate slows at either time t4 (set bit) or after t6 (reset bit), comparator SD1 switches to a low logic value. Switching of first comparator SD1 to low is detected in the timing circuit 545 which generates disabling signal DIS for the read current source 24 and, after a preset delay, generates a latching pulse SH, causing latching of the output of the second comparator SD2 by latch 555. In the meantime, if the bit is set, differentiated voltage Vdset is fallen below the second adjustable voltage Vd2 (time t5) and has caused switching of the second comparator SD2 to high. Thus, the bit is then latched as a set bit "1".

If instead, the differentiated voltage Vd exceeds Vref, comparator 42 switches. Switching of the comparator 42 causes stopping of the reading current Iread through timing circuit 545 and disabling signal DIS. Furthermore, switching of the comparator 42 is sensed by timing circuit 545 which, after a preset delay, generates the latching pulse SH, causing latching of the output of the second comparator SD2 by latch 555. If the bit is reset, the differentiated voltage Vd falls slowly; therefore, after the delay, the second comparator SD2 has not switched and output SAout is low. Thus, the bit is then latched as a reset bit "0".

In addition, if, after a timeout from switching of the first comparator SD1 from low to high (time t3 in FIG. 2) the column selected column voltage C has not exceeded Vref or the first comparator SD1 has not switched to low, reading current Iread is stopped through disabling signal DIS.

In a further read embodiment, the dynamic timing may also allow reading the bit state by sensing the rate at which the column charging slows as the column approaches the trigger point, respectively Vth(ots) for a set bit and Vth(oums) for a reset bit. When the differentiated voltage Vd drops below the voltage Vd2, in the case of a set bit, the output signal of the second comparator SD2 again switches back to a high logic value. Then, the timing block 545 receives a positive going switching control signal from the second comparator SD2. Accordingly, the timing circuit 545 asserts the timing signal SH and enables the latch 555 to store the value of the output signal from the comparator SD2, if now high, as a set bit.

Otherwise, after a predetermined time-out period, (such as 10 nanoseconds) from switching of the first comparator SD1, the output signal of the comparator SD2 is still at a low logic value and the timing block 545 enables the latch 555. Or the column may reach Vref, which also triggers latching a zero and closing the read cycle by stopping the read current Iread.

Detecting the slowing of the column charging may appropriately limit the read timing, delay, and duration of the read current pulse to assure that neither the memory 12b nor threshold element 12a switch, thus allowing use of a higher amplitude and faster charging read current. If the read current is selected to be greater then Ith of either the memory threshold element for better speed, the techniques of sensing a change in rate of column charging should be used effectively to avoid thresholding either the memory or threshold element. Particularly, the column voltage C may be sensed before reaching a steady state, improving speed and allowing use of a current greater than Ith(oum). In some embodiments, using a current pulse having an amplitude substantially equal to or greater than the threshold current of the memory element 12b may improve read delay. In some embodiments, the duration of the pulse can be limited so as to reduce spurious programming of memory elements 12b by avoiding more than Vth (oum) being applied across a reset bit or Vth(ots) across a reset or set bit during reading.

With adjustment in the charging rate of the column (by adjusting read current magnitude), Vdreset may decline below Vd1 but not Vd2 during an allowed timeout. Vdset for a set bit declines below both Vd1 and Vd2 (or even goes negative) and trips the comparators SD1 and SD2. This comparator output Vd1 may more optimally be used to start "timeout" the data strobe using timing circuit 545 instead of other timeout approaches or voltage sensing of Vref, and thus start latch 555 as compared to a fixed timeout approach, to detect set. So, data is latched shortly after the column exceeds the select device threshold voltage without waiting to see if the Vref is exceeded by the voltage C (or not exceeded). The reference voltage Vref into comparator 42, if exceeded, signals that the bit being read is reset. The bit is set if Vref is not exceeded after an appropriate timeout.

The embodiment of FIGS. 1 to 4 may be further enhanced by using a peak detector on the rate detector output voltage Vd. The peak detector allows comparison of the column rate of change relative to a peak rate of change during reading the bit to find how much the column rate of change has decreased relative to peak Vd, as will be apparent to those reasonably skilled in the art.

Figure 5:
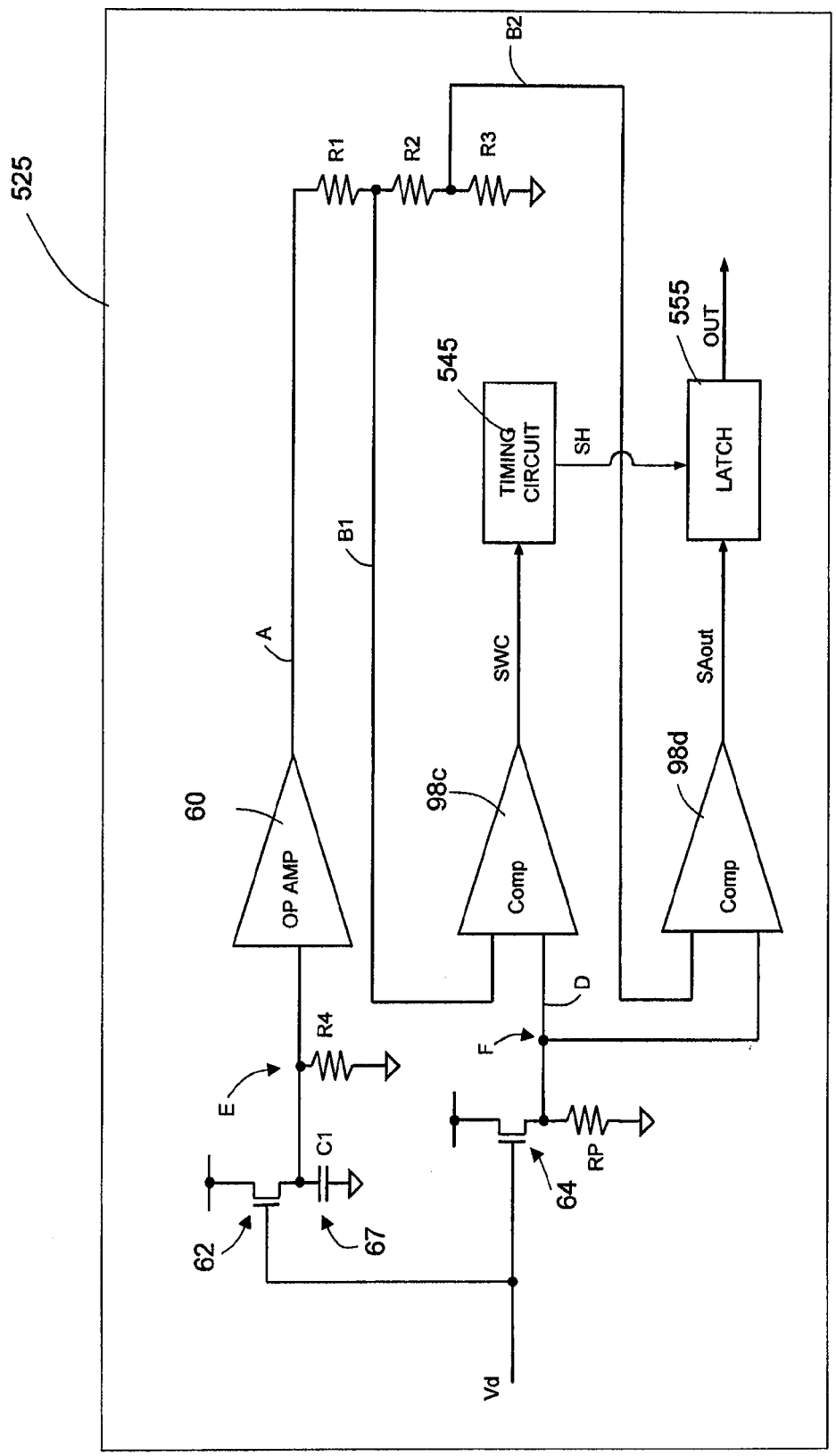
FIG. 5 is a circuit diagram for another embodiment of the present invention.

In FIG. 5 a peak detector is used, to improve accuracy. Here, the comparators SD1 and SD2 are replaced, and the differentiated voltage Vd is fed to a transistor 64 operating as a source follower and connected to an input of two comparators 98c and 98d that sense (follow) the selected column node charging rate, Vd. Also, another transistor 62 operating as a source follower creates a similarly translated peak rate of change voltage. This voltage is buffered through a unity gain operational amplifier 60 and level translated by a resistor divider R1, R2, and R3, that creates lower voltages B1 and B2. In the alternative, the voltage divider may be capacitive. A relatively high value resistor R4 is coupled in parallel with a capacitance C1 to an input node of unity gain operational amplifier 60 to reset the node between read cycles, the resistance set to have an R4C1 delay of about 200 nsec.

In FIG. 5, the peak is detected on capacitor C1. The voltages F and E are driven by transistors 62 and 64. Additional N channel transistors may be added to drive the source of each of these source followers to ground at the end of the cycle, to reset the nodes until the next read cycle.

R1, R2, or R3 may be trimmed using, for example, laser fuse repair techniques. Intermediate voltages B1 and B2 dynamically adjust the reference inputs to comparators 98c and 98d that track with the peak of Vd, reflected at E and A. Comparators 98c and 98d perform a similar function as SD1 and SD2 in FIG. 1. However, the reference DC voltages 540 and 550 of FIG. 1 are replaced in FIG. 5 with dynamically adjusting reference levels B and C respectively.

In the FIG. 5 embodiments, the rate of change is compared to voltages during the read cycle. Initially, the selected column voltage C charges positively at the fastest rate because, until the threshold device 12a triggers, the resistance of the selected cell is highest and voltage across it lowest. Initially, most of the read current charges capacitance and establishes the fastest possible rate of change on the column. This peak rate of change is detected, translated, and stored during the rest of the read cycle on the input to operational amplifier 60, node E, and similarly on buffered node A. The voltage on node E across R4 and C1 can be driven up in voltage relatively fast. However, the time constant of R4C1 is large enough compared to the active portion of the read cycle so that E decays down slowly, slow enough so that the peak established declines in voltage very little during the rest of the read cycle after the peak is reached.

The bit is reset if the rate of charging the column declines less compared to the peak sensed relative to a set bit. For the reset case, the voltage F at the input of comparators 98c and 98d falls below first intermediate voltage B1 but not below second intermediate voltage B2. By using a peak detector, B1 may be set relatively much closer to the peak rate of change stored on A. Any bit-to-bit variables such as selected column bit line capacitance affect the peak, and on a bit to bit basis so these variable become less significant reduction in margin with peak detection. Accordingly, with a peak detector used to set the reference voltages equivalent to Vd1 and Vd2, the comparison of a reset bit rate of column change may be more accurately compared to the peak rate of change to better decide when and how much the column rate of charging decreases as the column approaches where the Vth trigger is. For a reset bit, the trigger voltage is Vth(oum)+Vth(ots) and for a set bit the trigger voltage is closer to Vth(ots). However, by using a current less than the lesser of Ith(ots) or Ith(oum) or using a clamp or timeout to keep the current below this level, triggering either the memory element 12b or threshold device 12a is avoided with an improvement in endurance and margin over other techniques.

If the bit is set, voltage F falls below both voltages B1 and B2. With more accurate setting of the peak rate of change and by sensing and storing it, both levels B1 and B2 can be set closer to the peak rate of change, and yet assuredly less than the peak rate of change due to the improved accuracy in setting the levels relative to the peak rate, thus better accommodating bit to bit variation.

Voltage F tracks the selected column line up and down, translated for Vgs of transistor 64. Sensing a slow down in the rate of the column charging can be used to timeout the column to latch the data and close the read cycle. For example, if voltage F at the input to comparators 98c and 98d first rises above and then falls below both voltages B1 and B2, the bit is set and the cycle may close when the node is below B2. Similarly, after voltage F exceeds and then falls below B1, a timeout may be started. In a short period thereafter, such as 10 nsec, the cycle may close if the voltage F has not fallen below voltage B2 and the data may be latched as reset. This latter approach helps assure that Vref is not exceeded, and may be even be used by those reasonably skilled in the art to eliminate Vref.

Thus, the circuit of FIG. 5 may act as a peak detector to more precisely start the timing for the circuit of FIG. 1. And, the circuit may be used to determine cell state without using a Vref, while still assuring that the column voltage does not place more than the threshold voltage across the memory element 12b or threshold device 12a, such as when it is reset in a higher resistance state.

The peak detector of FIG. 5 may further refine the sensing of the rate change, by sensing a substantial decline from the peak of the rate detector output voltage of operational amplifier 60 by the circuit in FIG. 5. The decline occurs at t4 (FIG. 2) in the set case and t6 for the reset case. The decline occurs at about the sum of the threshold voltage of memory element 12b and threshold device 12a, where for a set case the threshold voltage may be about 0V, and hence the decline in rate of charging may start at a lower voltage as more current is diverted through the lowering resistance of the series pair selected (memory element 12b and threshold device 12a).

Any decline is more precisely sensed relative to peak (instead of on an absolute basis affected by variation in Vh, dV/dI, bit to bit variation in column capacitance etc). If a significantly increased rate of change in slope does not occur within a time-out after selected column charging starts (t2) or sooner (such as after a few nanoseconds) after the column charging rate falls below Vd1, the data may be latched as reset, and otherwise as set. Or, after a time-out from t2 (start of cycle) or t4 or t6, the column may be compared to Vref and the cycle stopped. For each case either the cycle must be stopped before the cell current can increase above the threshold current of either the memory or threshold device, or else the read current should be set at less the lowest Ith(oum) or Ith(ots) in the array, with some margin for variation over time and write cycles.

By use of a peak detector, variations in resistance of threshold device 12a or bit line capacitance may be better accommodated. That is, the rate of initial charging the column is self adjusting bit by bit. Hence, the peak voltage on C1 is sensed and stored for reduction by the voltage divider R1-R3. Using dynamic voltages improves margin in sensing when the threshold device turns on, and assures better detection when the bit is set with the potential for reduced read access delay by not having to time-out to sense a set bit.

To further insure that Vth(oum) or Vth(ots) is not exceeded through the column voltage charging to an excessively high voltage that may threshold a reset memory element 12b or threshold device 12a, the voltage on the column may be sensed. If a voltage greater than a clamping Vref is reached, the read current may be stopped and the cell state latched as reset. This is an alternate time to strobe the latch instead of only waiting for the timeout when using the embodiment of FIG. 5. Also, this can be a further assurance in stopping the cycle if the bit is reset, rather than waiting only for a timeout from t4 or t2, using a peak detector or not.

FIG. 6 is a graph of current versus voltage for a memory element 12b of the phase change thin film layer type in the reset state. The trigger point, for example 1V, is Vth(oum) and the current at trigger is Ith(oum). For example, Ith(oum) may be 10 µa, depending on the selection of area of the contacts, thickness of the device, and type of alloy and contacts to surfaces. If the bit is programmed into the set state, the IV curve is instead approximately that of the dotted line toward Vh(oum) and bending smoothly into the origin (a low resistance sweep from the origin that changes to even lower resistance at Vh(oum), and onto the dV/dI dynamic resistance above Vh).

FIG. 7 is a depiction of current versus voltage for a threshold device 12a. Here, for example, the trigger voltage Vth(ots) is 2V. The threshold current Ith(ots), for example about 10 µa, depends in magnitude on the selected area of the contacts, thickness of the device, and type of alloy and contacts to the surface.

Figure 8:
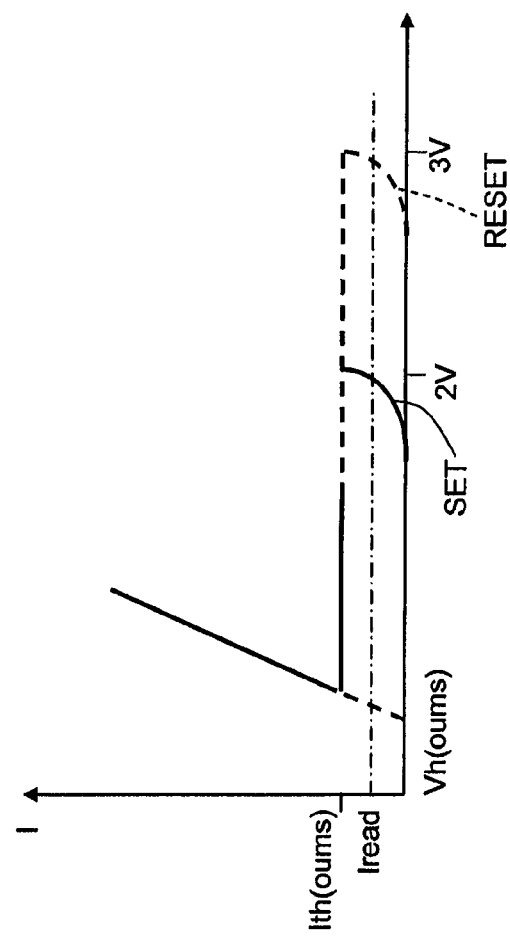
FIG. 8 is a graph of current versus voltage showing the read current and a read voltage for the set and reset cases.

When the threshold device 12a and memory element 12b are connected in series, either by conventional interconnect on the same or a different integrated circuit, the resulting IV curve of the combined circuit (one or more memory elements in series with one or more threshold devices) is as shown in FIG. 8, for a set and a reset case.

By programming the memory element 12b into the low resistance set state, the IV curve transitions (triggers) from high resistance below 2V to low resistance (after application of voltage greater than Vth(ots) or current greater than Ith (ots)). Then, after the device triggers, the IV curve retraces towards the Y axis, and follows a dynamic resistance dV/dI with an extrapolated intercept of Vh(oums).

In contrast, by programming the memory element 12b into the high resistance/higher threshold voltage reset state, the IV curve makes a similar transition but at a higher voltage, here shown as 3V (approximately Vth(oum)reset+Vth(ots). The current at which this occurs may be either Ith(ots) or Ith (oum), whichever is less (since triggering one collapses the voltage and forces more voltage across the other and further increases the current through both, due to transient di/dt current from the reducing voltage across both).

The dynamic resistance as the memory cell 12 (threshold device 12a and memory element 12b) approaches threshold may be significantly higher for the reset case. Similarly, the dV/dI after triggering the memory cell 12 may be the series combination of the dV/dI(oum) plus dV/dI(ots), with an intercept of Vh(oums). The Vh(oums) may be approximately equal to the Vh(oum) plus Vh(ots) of the individual devices.

Figure 9:
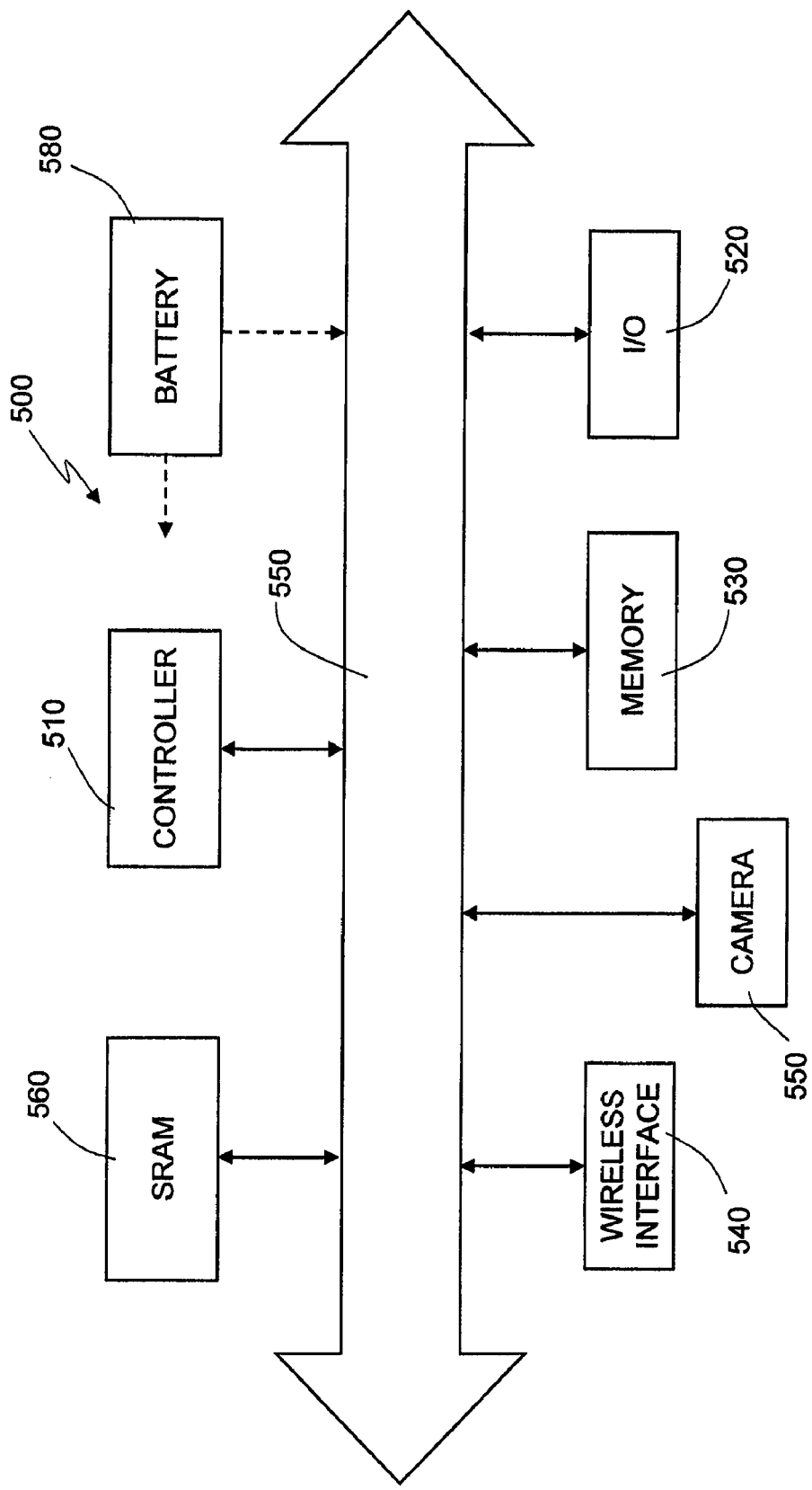
FIG. 9 is a system depiction according to one embodiment of the present invention.

Turning to FIG. 9, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 includes a controller 510, an input/output (I/O) device 520 (e.g., a keypad, display), a memory 530, a wireless interface 540, a digital camera 550, and a static random access memory (SRAM) 560 and coupled to each other via a bus 550. A battery 580 supplies power to the system 500. It should be noted that the scope of the present invention is not limited to embodiments having any or all of these components.

Controller 510 may comprise, for example, one or more microprocessors, digital signal processors, micro-controllers, or the like. Memory 530 may be used to store messages transmitted to or by system 500. Memory 530 may also optionally be used to store instructions that are executed by controller 510 during the operation of system 500, and may be used to store user data. The instructions may be stored as digital information and the user data, as disclosed herein, may be stored in one section of the memory as digital data and in another section as analog memory. As another example, a given section at one time may be labelled as such and store digital information, and then later may be relabelled and reconfigured to store analog information. Memory 530 comprises memory 10 illustrated in FIG. 1 incorporating one or more of the embodiments herein described.

The I/O device 520 may be used to generate a message. The system 500 may use the wireless interface 540 to transmit and receive messages to and from a wireless communication network with a radio frequency (RF) signal. Examples of the wireless interface 540 include an antenna, or a wireless transceiver, such as a dipole antenna, although the scope of the present invention is not limited in this respect. Also, the I/O device 520 may deliver a voltage reflecting what is stored as either a digital output (if digital information was stored), or it may be analog information (if analog information was stored).

While an example in a wireless application is provided above, embodiments of the present invention may also be used in non-wireless applications as well.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
reading a memory device that includes a memory cell including a memory element coupled in series to a threshold device, the reading including:
selecting an address line connected to said memory cell;
applying a reading current to the memory cell;
reading the memory cell when the memory element and the threshold device are unthresholded; and
interrupting the reading current.

2. The method of claim 1, comprising:
sensing whether a level on the selected address line is above or below a reference level.

3. The method of claim 1, including determining a rate of change of a voltage on the selected addressed line and determining if the memory cell is in a first or in a second state depending on the rate of change being higher or lower than a threshold.

4. The method of any of claim 1, including detecting a peak rate of change of a voltage on the selected address line.

5. The method of claim 4, including comparing the peak rate of change of the voltage on the selected address line to a subsequent rate of change of the voltage on the selected address line.

6. A memory device, comprising:
an array of memory cells, each memory cell including a memory element and a threshold device, series connected to each other;
an address line coupled to said memory cells,
a current source structured to drive said address line at a current that forces a current through the memory cell that is less than a threshold current of the memory element and of the threshold device; and
a sensing circuit structured to sense said address line while the memory element and the threshold device are still unthresholded.

7. The memory device of claim 6 wherein the sensing circuit includes a charging rate detector coupled to said address line and structured to sense a rate of change of a voltage on the address line.

8. The memory device of claim 7 wherein the charging rate detector comprises a differentiator coupled to said address line and structured to generate a differentiated voltage, and a differentiated voltage rate detector coupled to said differentiator.

9. The memory device of claim 8 wherein the charging rate detector comprises a timing circuit configured to be activated by the differentiated voltage rate detector when the differentiated voltage crosses a first threshold and a latching element configured to be set by said timing circuit and structured to latch the rate of change at the end of a delay from activation.

10. The memory device of claim 9, wherein the charging rate detector comprises:
a first comparator structured to compare said differentiated voltage with said first threshold and generate an activation signal for said timing circuit; and
a second comparator structured to compare said differentiated voltage with a second threshold, generate a reading output, and feed the reading output to said latching element.

11. The memory device of claim 10 wherein the charging rate detector comprises a reference generator structured to store a reference level which is a peak value of the differentiated voltage and said first and second thresholds are fractions of said reference level.

12. The memory device of claim 10, comprising a third comparator structured to sense whether the voltage on the selected address line is above or below a third threshold, said third comparator being configured to activate said timing circuit and/or said latching element upon detecting the voltage on the address line exceeding said third threshold.

13. The memory device of claim 7 wherein said sensing circuit is coupled to said current source and is structured to interrupt said reading current when the rate of change of the voltage on the selected address line decreases.

14. The memory device of claim 6 wherein said threshold device includes a chalcogenide.

15. A system, comprising:
a processor;
a battery coupled to said processor; and
a memory device that includes:
an array of memory cells, each memory cell including a memory element and a threshold device, series connected to each other;
an address line coupled to said memory cells,
a current source structured to drive said address line at a current that forces a current through the memory cell that is less than a threshold current of the memory element and of the threshold device; and
a sensing circuit structured to sense said address line while the memory element and the threshold device are still unthresholded.

16. The system of claim 15 wherein the sensing circuit includes a charging rate detector coupled to said address line and structured to sense a rate of change of a voltage on the address line.

17. The system of claim 16 wherein the charging rate detector comprises a differentiator coupled to said address line and structured to generate a differentiated voltage, and a differentiated voltage rate detector coupled to said differentiator.

18. The system of claim 16 wherein the charging rate detector comprises a timing circuit configured to be activated by the differentiated voltage rate detector when the differentiated voltage crosses a first threshold and a latching element configured to be set by said timing circuit and structured to latch the rate of change at the end of a delay from activation.

19. The system of claim 18, wherein the charging rate detector comprises:
a first comparator structured to compare said differentiated voltage with said first threshold and generate an activation signal for said timing circuit; and
a second comparator structured to compare said differentiated voltage with a second threshold, generate a reading output, and feed the reading output to said latching element.

20. The system of claim 19 wherein the charging rate detector comprises a reference generator structured to store a reference level which is a peak value of the differentiated voltage and said first and second thresholds are fractions of said reference level.

21. A memory device, comprising:
a memory cell including a memory element and a threshold device, series connected to each other; and
means for reading the memory cell, the means for reading including:
means for selecting an address line connected to said memory cell;
means for applying a reading current to the memory cell;

means for reading the memory cell when the memory element and the threshold device are unthresholded; and
means for interrupting the reading current.

22. The memory device of claim 21, comprising:
means for sensing whether a level on the selected address line is above or below a reference level.

23. The memory device of claim 21, including means for determining a rate of change of a voltage on the selected addressed line and determining if the memory cell is in a first or in a second state depending on the rate of change being higher or lower than a threshold.

24. The memory device of claim 21, including means for detecting a peak rate of change of a voltage on the selected address line.

25. The memory device of claim 24, including means for comparing the peak rate of change of the voltage on the selected address line to a subsequent rate of change of the voltage on the selected address line.

26. A memory device, comprising:
an array of memory cells, each memory cell including a memory element and a threshold device, series connected to each other;
an address line coupled to said memory cells,
a current source structured to drive said address line at a reading current; and
a sensing circuit structured to sense said address line, the sensing circuit including a charging rate detector coupled to said address line and structured to sense a rate of change of a an electrical quantity on the address line.

27. The memory device of claim 26 wherein the charging rate detector comprises a differentiator coupled to said address line and structured to generate a differentiated voltage, and a differentiated voltage rate detector coupled to said differentiator.

28. The memory device of claim 27 wherein the charging rate detector comprises a timing circuit configured to be activated by the differentiated voltage rate detector when the differentiated voltage crosses a first threshold and a latching element configured to be set by said timing circuit and structured to latch the rate of change at the end of a delay from activation.

29. The memory device of claim 28, wherein the charging rate detector comprises:
a first comparator structured to compare said differentiated voltage with said first threshold and generate an activation signal for said timing circuit; and
a second comparator structured to compare said differentiated voltage with a second threshold, generate a reading output, and feed the reading output to said latching element.

30. The memory device of claim 29 wherein the charging rate detector comprises a reference generator structured to store a reference level which is a peak value of the differentiated voltage and said first and second thresholds are fractions of said reference level.

31. The memory device of claim 29, comprising a third comparator structured to sense whether the voltage on the selected address line is above or below a third threshold, said third comparator being configured to activate said timing circuit and/or said latching element upon detecting the voltage on the address line exceeding said third threshold.

32. The memory device of claim 27 wherein said sensing circuit is coupled to said current source and is structured to interrupt said reading current when the rate of change of the electrical quantity on the selected address line decreases.

* * * * *